United States Patent
Saxler

(10) Patent No.: US 7,615,774 B2
(45) Date of Patent: Nov. 10, 2009

(54) ALUMINUM FREE GROUP III-NITRIDE BASED HIGH ELECTRON MOBILITY TRANSISTORS

(75) Inventor: Adam William Saxler, Durham, NC (US)

(73) Assignee: Cree.Inc., Durham, NC (US)

( * ) Notice: Subject to any disclaimer, the term of this patent is extended or adjusted under 35 U.S.C. 154(b) by 447 days.

(21) Appl. No.: 11/118,575

(22) Filed: Apr. 29, 2005

(65) Prior Publication Data
US 2006/0244010 A1   Nov. 2, 2006

(51) Int. Cl.
H01L 29/06 (2006.01)
H01L 31/0328 (2006.01)
H01L 31/0336 (2006.01)
H01L 31/072 (2006.01)
H01L 31/109 (2006.01)

(52) U.S. Cl. .......................... 257/20; 257/24; 257/194; 257/E29.246

(58) Field of Classification Search .................. 257/20, 257/24, 194, E29.246, E29.247, E29.248, 257/E29.252, E29.253
See application file for complete search history.

(56) References Cited

U.S. PATENT DOCUMENTS

| 4,424,525 | A | 1/1984 | Mimura |
|---|---|---|---|
| 4,471,366 | A | 9/1984 | Delagebeaudeuf et al. |
| 4,727,403 | A | 2/1988 | Hida et al. |
| 4,755,867 | A | 7/1988 | Cheng |
| 4,788,156 | A | 11/1988 | Stoneham et al. |
| 4,946,547 | A | 8/1990 | Palmour et al. |
| 5,053,348 | A | 10/1991 | Mishra et al. |
| 5,172,197 | A | 12/1992 | Nguyen et al. |
| 5,192,987 | A | 3/1993 | Khan et al. |
| 5,200,022 | A | 4/1993 | Kong et al. |
| 5,210,051 | A | 5/1993 | Carter, Jr. |
| 5,296,395 | A | 3/1994 | Khan et al. |
| 5,298,445 | A | 3/1994 | Asano |
| RE34,861 | E | 2/1995 | Davis et al. |
| 5,389,571 | A | 2/1995 | Takeuchi et al. |
| 5,393,993 | A | 2/1995 | Edmond et al. |
| 5,523,589 | A | 6/1996 | Edmond et al. |
| 5,534,462 | A | 7/1996 | Fiordalice et al. |
| 5,592,501 | A | 1/1997 | Edmond et al. |
| 5,686,737 | A | 11/1997 | Allen |

(Continued)

FOREIGN PATENT DOCUMENTS

EP   0 334 006 A1   9/1989

(Continued)

OTHER PUBLICATIONS

International Search Report and Written Opinion for PCT/US2006/006146; Date of mailing Sep. 25, 2006.

(Continued)

*Primary Examiner*—Thien F Tran
(74) *Attorney, Agent, or Firm*—Myers Bigel Sibley & Sajovec

(57) ABSTRACT

Aluminum free high electron mobility transistors (HEMTs) and methods of fabricating aluminum free HEMTs are provided. In some embodiments, the aluminum free HEMTs include an aluminum free Group III-nitride barrier layer, an aluminum free Group III-nitride channel layer on the barrier layer and an aluminum free Group III-nitride cap layer on the channel layer.

14 Claims, 12 Drawing Sheets

U.S. PATENT DOCUMENTS

| | | | |
|---|---|---|---|
| 5,700,714 A | 12/1997 | Ogilhara et al. | |
| 5,701,019 A | 12/1997 | Matsumoto et al. | |
| 5,705,827 A | 1/1998 | Baba et al. | |
| 5,804,482 A | 9/1998 | Konstantinov et al. | |
| 5,885,860 A | 3/1999 | Weitzel et al. | |
| 5,946,547 A | 8/1999 | Kim et al. | |
| 5,990,531 A | 11/1999 | Taskar et al. | |
| 6,028,328 A | 2/2000 | Riechert et al. | |
| 6,046,464 A | 4/2000 | Schetzina | |
| 6,051,849 A | 4/2000 | Davis et al. | |
| 6,064,082 A | 5/2000 | Kawai et al. | |
| 6,086,673 A | 7/2000 | Molnar | |
| 6,150,680 A | 11/2000 | Eastman et al. | |
| 6,177,685 B1 | 1/2001 | Teraguchi et al. | |
| 6,177,688 B1 | 1/2001 | Linthicum et al. | |
| 6,218,680 B1 | 4/2001 | Carter, Jr. et al. | |
| 6,255,198 B1 | 7/2001 | Linthicum et al. | |
| 6,261,929 B1 | 7/2001 | Gehrke et al. | |
| 6,316,793 B1 | 11/2001 | Sheppard et al. | |
| 6,376,339 B2 | 4/2002 | Linthicum et al. | |
| 6,377,596 B1 * | 4/2002 | Tanaka et al. | 372/45.01 |
| 6,380,108 B1 | 4/2002 | Linthicum et al. | |
| 6,429,467 B1 | 8/2002 | Ando | |
| 6,448,648 B1 | 9/2002 | Boos | |
| 6,462,355 B1 | 10/2002 | Linthicum et al. | |
| 6,486,042 B2 | 11/2002 | Gehrke et al. | |
| 6,489,221 B2 | 12/2002 | Gehrke et al. | |
| 6,492,669 B2 | 12/2002 | Nakayama et al. | |
| 6,498,050 B2 * | 12/2002 | Fujimoto | 438/48 |
| 6,515,316 B1 | 2/2003 | Wojtowicz et al. | |
| 6,521,514 B1 | 2/2003 | Gehrke et al. | |
| 6,545,300 B2 | 4/2003 | Gehrke et al. | |
| 6,548,333 B2 | 4/2003 | Smith | |
| 6,570,192 B1 | 5/2003 | Davis et al. | |
| 6,582,906 B1 | 6/2003 | Cao et al. | |
| 6,582,986 B2 | 6/2003 | Kong et al. | |
| 6,586,778 B2 | 7/2003 | Linthicum et al. | |
| 6,586,781 B2 | 7/2003 | Wu et al. | |
| 6,602,763 B2 | 8/2003 | Davis et al. | |
| 6,602,764 B2 | 8/2003 | Linthicum et al. | |
| 6,608,327 B1 | 8/2003 | Davis et al. | |
| 6,621,148 B2 | 9/2003 | Linthicum et al. | |
| 6,639,255 B2 | 10/2003 | Inoue et al. | |
| 6,686,261 B2 | 2/2004 | Gehrke et al. | |
| 6,706,114 B2 | 3/2004 | Mueller | |
| 6,825,559 B2 * | 11/2004 | Mishra et al. | 257/728 |
| 6,841,001 B2 | 1/2005 | Saxler | |
| 6,849,882 B2 | 2/2005 | Chavarkar et al. | |
| 7,352,008 B2 * | 4/2008 | Kohn et al. | 257/83 |
| 2001/0015446 A1 | 8/2001 | Inoue et al. | |
| 2001/0020700 A1 | 9/2001 | Inoue et al. | |
| 2001/0023964 A1 | 9/2001 | Wu et al. | |
| 2001/0040246 A1 | 11/2001 | Ishii | |
| 2002/0008241 A1 | 1/2002 | Edmond et al. | |
| 2002/0017696 A1 | 2/2002 | Nakayama et al. | |
| 2002/0066908 A1 | 6/2002 | Smith | |
| 2002/0079508 A1 | 6/2002 | Yoshida | |
| 2002/0119610 A1 | 8/2002 | Nishii et al. | |
| 2002/0167023 A1 | 11/2002 | Charvarkar et al. | |
| 2003/0017683 A1 | 1/2003 | Emrick et al. | |
| 2003/0020092 A1 | 1/2003 | Parikh et al. | |
| 2003/0102482 A1 | 6/2003 | Saxler | |
| 2003/0123829 A1 | 7/2003 | Taylor | |
| 2003/0145784 A1 | 8/2003 | Thompson et al. | |
| 2003/0155578 A1 * | 8/2003 | Kohn et al. | 257/83 |
| 2003/0157776 A1 | 8/2003 | Smith | |
| 2003/0213975 A1 | 11/2003 | Hirose et al. | |
| 2003/0218183 A1 | 11/2003 | Micovic et al. | |
| 2004/0004223 A1 | 1/2004 | Nagahama et al. | |
| 2004/0021152 A1 | 2/2004 | Nguyen et al. | |
| 2004/0029330 A1 | 2/2004 | Hussain et al. | |
| 2004/0061129 A1 | 4/2004 | Saxler et al. | |
| 2004/0241970 A1 | 12/2004 | Ring | |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 2001230407 A | 8/2001 |
| JP | 2002016087 A | 1/2002 |
| JP | 2004-342810 | 12/2004 |
| WO | WO 93/23877 A1 | 11/1993 |
| WO | WO 01/57929 A1 | 8/2001 |
| WO | WO 01/92428 A1 | 12/2001 |
| WO | WO 01/92428 A2 | 12/2001 |
| WO | WO 01/92428 A3 | 12/2001 |
| WO | WO 03/049193 A1 | 6/2003 |
| WO | WO 2004/008495 | 1/2004 |

OTHER PUBLICATIONS

Kong et al. "A novel $In_xGa_{1-x}$ N/InN heterostructure field-effect transistor with extremely high two-dimensional electron-gas sheet density" *Solid-State Electronics* 49:199-203 (2005).

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 6, pp. 3222-3233 (Mar. 1999).

Ando et al., "10-W/mm AlGaN-GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Elecronics Letters*. vol. 33, No. 14, pp. 1230-1231 (1997).

Beaumont, B. et al., "Epitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETS," *Solid-State Electronics*. vol. 41, No. 2, pp. 247-250 (1997).

Heikman, Sten J., *MOCVD Growth Technologies for Applications in AlGaN/GaN High Electron Mobility Transistors*, Dissertation, University of California—Santa Barbara, Sep. 2002, 190 pages.

Parikh et al., "Development of Gallium Nitride Epitaxy and Associated Material-Device Correlation for RF, Microwave and MM-wave Applications," Cree, Inc. (35 slides).

Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum*. vols. 338-342, pp. 1643-1646, (2000).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Samoff Symposium*, Pittsburgh, PA, Mar. 18, 1998.

Sullivan et al. "High-Power 10-GHz Operation of AlGaN HFET's on Insulating SiC," *IEEE Electron Device Letters*. vol. 19, No. 6, pp. 198-200 (Jun. 1998).

"Thick AlN template on SiC substrate—Novel semi insulating substrate for GaN-based devices," © 2003 by TDI, Inc., http://www.tdii.com/products/AlN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Improved Dielectric Passivation for Semiconductor Devices," U.S. Appl. No. 10/851,507, filed May 22, 2004 (Cree Docket No. P0274).

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Co-Doping for Fermi Level Control in Semi-Insulating Group III Nitrides," U.S. Appl. No. 10/752,970, filed Jan. 7, 2004.

United States Patent Application entitled "Cap Layers and/or Passivation Layers for Nitride-Based Transistors, Transistor Structures and Methods of Fabricating the Same," U.S. Appl. No. 10/996,249, filed Nov. 23, 2004.

United States Patent Application entitled "Methods of Having Laterally Grown Active Region and Methods of Fabricating Same," U.S. Appl. No. 10/899,215, filed Jul. 26, 2004.

United States Patent Application entitled "Silicon Carbide on Diamond Substrates and Related Devices and Methods," U.S. Appl. No. 10/707,898, filed Jan. 22, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "Semiconductor Devices Having A Hybrid Channel Layer Current Aperture Transistors and Methods of Fabricating Same" U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive And Insulating or Semi-Insulating Group III-Nitrides For Group III-Nitride Devices," U.S. Appl. No. 11/103,127, filed Apr. 11, 2005.

United States Patent Application entitled "Thick Semi-Insulating of Insulating Epitaxial Gallium Nitride Layers and Devices Incorporating Same," U.S. Appl. No. 11/103,117, filed Apr. 11, 2005.

Burm et al. "Ultra-Low Resistive Ohmic Contacts on n-GaN Using Si Implantation," *Applied Physics Letters*. vol. 70, No. 4, 464-66 (1997).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chen et al. "Cl2 reactive ion etching for gate recessing of AlGaN/GaN field-effect transistors," *J. Vac. Sci. Technol. B.* vol. 17, No. 6, pp. 2755-2758 (1999).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys*. 33:775-778 (1994).

Coffie et al., Unpassivated p-GaN/AlGaN/GaN HEMTs with 7.1 W/MMF at 10 GHz, *Electronic Letters online* No. 20030872, 39(19), (Sep. 18, 2003).

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, pp. 479-485 (Mar. 2001).

Egawa et al. "Recessed gate AlGaN/GaN MODFET on Sapphire Grown by MOCVD," *Applied Physics Letters*. vol. 76, No. 1, pp. 121-123 (Jan. 2000).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gaska et al. "High-Temperature Performance of AlGaN/GaN HFET's on SiC Substrates," *IEEE Electron Device Letters*. vol. 18, No. 1, pp. 492-494 (Oct. 1997).

Gaska et al., "Self-Heating in High-Power AlGaN/GaN HFET's," *IEEE Electron Device Letters*, 19(3), pp. 89-91 (Mar. 1998).

Gelmont et al. "Monte Carlo simulation of electron transport in gallium nitride," *Journal of Applied Physics*. vol. 74, No. 3, pp. 1818-1821 (Aug. 1993).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, et al., "Mass Transport Regrowth of GaN for Ohmic Contacts to AlGaN/GaN," *Applied Physics Letters*. vol. 78, No. 19, pp. 2876, (May 2001).

Heikman et al. "Polarization Effects in AlGaN/GaN and GaN/AlGaN/GaN heterostructures," *Journal of Applied Physics*. vol. 93, No. 12, pp. 10114-10118 (Jun. 2003).

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "RESURF AlGaN/GaN HEMT for High Voltage Power Switching," *IEEE Electron Device Letters*. vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kasahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ-Doped InP Supply Layers and p-InP Barrier Enhancement Layer Grown by LP-MOVPE," *IEEE Electron Device Letters*, 14(1), (Jan. 1993).

Kuzmik et al. "Annealing of Schottky contacts deposited on dry etched AlGaN/Gan," *Semiconductor Science and Technology*. vol. 17, No. 11 (Nov. 2002).

Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Neuburger et al. "Design of GaN-based Field Effect Transistor Structures based on Doping Screening of Polarization Fields," WA 1.5, 7$^{th}$ Wide-Gandgap III-Nitride Workshop (Mar. 2002).

Saxler et al., "III-Nitride Heterostructures on High-Purity Semi-Insulating 4H-SiC Substrates for High-Power RF Transistors," International Workshop on Nitride Semiconductors (Jul. 19, 2004).

United States Patent Application entitled "Thick Semi-Insulating or Insulating Epitaxial Gallium Nitride Layers and Devices Incorporating Same," U.S. Appl. No. 11/103,117, filed Apr. 11, 2005.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc., (2003).

Wu et al., "3.5-Watt AlGaN/GaN HEMTs and Amplifiers at 35 GHz," Cree Santa Barbara Technology Center, Goleta, CA 93117., (2003).

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al. "High Al-Content AlGaN/GaN MODFET's for Ultrahigh Performance," *IEEE Electron Device Letters*. vol. 19, No. 2, pp. 50-53 (Feb. 1998).

Wu et al., "Linearity Performance of GaN HEMTs With Field Plates," DRC 2004, Cree, Inc., (2004).

Wu et al., "Linearity Performance of GaN HEMTs With Field Plates," Cree Santa Barbara Technology Center, Goleta, CA 93117., (2004).

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

European Search Report, European Application No. 06 735 699.8, Jan. 14, 2009, 4 pages.

\* cited by examiner

ALUMINUM FREE GROUP III-NITRIDE BASED HIGH ELECTRON MOBILITY TRANSISTORS

FIELD OF THE INVENTION

The present invention relates to semiconductor devices and, more particularly, to transistors that incorporate nitride-based active layers.

BACKGROUND

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

Conventional HEMTs typically have an AlGaN layer on a GaN channel layer. However, the presence of aluminum in the active region of the device may reduce the reliability of the device as a result of oxidation effects, dislocation related pits and/or the presence of DX centers.

SUMMARY OF THE INVENTION

Some embodiments of the present invention provide high electron mobility transistors (HEMTs) and methods of fabricating HEMTs that include an aluminum free Group III-nitride barrier layer, an aluminum free Group III-nitride channel layer on the barrier layer and an aluminum free Group III-nitride cap layer on the channel layer. In some embodiments of the present invention, the barrier layer comprises a doped Group III-nitride region adjacent the aluminum free Group III-nitride channel layer. An undoped Group III-nitride layer may also be provided disposed between the doped Group III-nitride region and the channel layer.

In additional embodiments of the present invention, the cap layer comprises a first doped Group III-nitride region adjacent the aluminum free Group III-nitride channel layer. An undoped Group III-nitride layer may be disposed between the first doped Group III-nitride region and the channel layer.

In some embodiments of the present invention, the barrier layer comprises a GaN layer, the channel layer comprises an InGaN layer and the cap layer comprises a GaN layer. The barrier layer may have a thickness of from about 0.1 µm to about 1000 µm, the channel layer may have a thickness of from about 1 nm to about 20 nm and the cap layer may have a thickness of from about 5 nm to about 100 nm. The InGaN layer may have a percentage of indium of from about 1 to about 100 percent.

In additional embodiments of the present invention, a first doped GaN layer is disposed between the GaN barrier layer and the InGaN channel layer. The first doped GaN layer may comprise a Si, Sn, O and/or Ge doped GaN layer. The first doped GaN layer may have a thickness of from about 0.2 nm to about 10 nm. The first doped GaN layer may have a dopant concentration of from about $1\times10^{16}$ cm$^{-3}$ to about $1\times10^{21}$ cm$^{-3}$. A first undoped GaN layer may be disposed between the first doped GaN layer and the InGaN channel layer. The first undoped GaN layer may have a thickness of from about 0.3 nm to about 5 nm.

In further embodiments of the present invention, a first doped GaN layer is disposed between the GaN cap layer and the InGaN channel layer. The first doped GaN layer disposed between the GaN cap layer and the InGaN channel layer may comprise a Si, Sn, O and/or Ge doped GaN layer. The first doped GaN layer disposed between the GaN cap layer and the InGaN channel layer may have a thickness of from about 0.2 nm to about 10 nm. The first doped GaN layer disposed between the GaN cap layer and the InGaN channel layer may have a dopant concentration of from about $1\times10^{16}$ cm$^{-3}$ to about $1\times10^{21}$ cm$^{-3}$. A first undoped GaN layer may be disposed between the first doped GaN layer and the InGaN channel layer. The first undoped GaN layer disposed between the first doped GaN layer and the InGaN layer may have a thickness of from about 0.3 nm to about 5 nm. A second doped GaN layer may be disposed between the GaN barrier layer and the InGaN channel layer. The second doped GaN layer disposed between the GaN barrier layer and the InGaN channel layer may comprise a Si, Sn, O and/or Ge doped GaN layer. The second doped GaN layer disposed between the GaN barrier layer and the InGaN channel layer may have a thickness of from about 0.2 nm to about 10 nm. The second doped GaN layer disposed between the GaN barrier layer and the InGaN channel layer may have a dopant concentration of from about $1\times10^{16}$ cm$^{-3}$ to about $1\times10^{21}$ cm$^{-3}$. A second undoped GaN layer may be disposed between the second doped GaN layer and the InGaN channel layer. The second undoped GaN layer may have a thickness of from about 0.3 nm to about 5 nm.

In additional embodiments of the present invention, an InGaN layer is provided on the GaN cap layer opposite the InGaN channel layer. The InGaN layer on the GaN cap layer opposite the InGaN channel layer may have a thickness of from about 0.3 nm to about 100 nm.

In some embodiments of the present invention, a metal semiconductor field effect transistor (MESFET) is provided.

DETAILED DESCRIPTION OF EMBODIMENTS OF THE INVENTION

Figure 1:
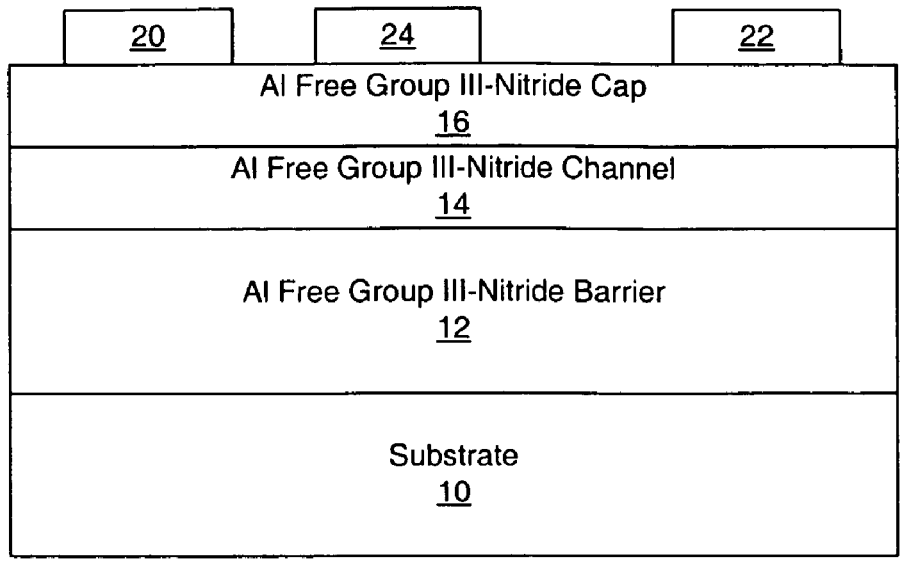
FIG. 1 is a cross-section of an aluminum free Group III-nitride based HEMT according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Embodiments of the present invention provide aluminum free nitride-based HEMTs such as Group III-nitride based devices. As used herein, the term "Group III nitride" refers to those semiconducting compounds formed between nitrogen and the elements in Group III of the periodic table, gallium (Ga), and/or indium (In). As is well understood by those in this art, the Group III elements can combine with nitrogen to form binary (e.g., GaN), ternary (e.g., InGaN), and quaternary compounds. These compounds all have empirical formulas in which one mole of nitrogen is combined with a total of one mole of the Group III elements. Accordingly, formulas such as $In_xGa_{1-x}N$ where $0 \leq x \leq 1$ are often used to describe them.

Furthermore, as used herein, aluminum free refers to the absence of Al intentionally incorporated into active layers of the Group III-nitride based device. For example, in some embodiments a region or layer with less than about 1% Al may be considered aluminum free. Thus, an active layer of a device may be Al free even if some Al is present in the active layer, for example, through unintentional incorporation by contamination during fabrication. Active layers of a device are the layers of the device where the 2DEG is formed and layers disposed between the layers where the 2DEG is formed and the source, drain and/or gate contacts and/or contact layers (i.e. layers on which a contact is directly formed) of the device. Aluminum is not, however, intentionally incorporated in the layers that form the 2DEG. Accordingly, in some embodiments of the present invention, Al may be present in layers between the layers that form the 2DEG and a substrate, in contacts and/or in the substrate. For example, Al may be in the substrate, nucleation and/or buffer layers and/or the ohmic contacts.

FIG. 1 illustrates a HEMT structure according to some embodiments of the present invention. As seen in FIG. 1, a substrate 10 is provided on which Group III-nitride based devices may be formed. In particular embodiments of the present invention, the substrate 10 may be a silicon carbide (SiC) substrate that may be, for example, 4H polytype of silicon carbide. Other silicon carbide candidate polytypes include the 3C, 6H, and 15R polytypes. In particular embodiments of the present invention, the substrate 10 may be semi-insulating. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature. In other embodiments of the present invention, the substrate 10 may be conductive.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned U.S. Patent Publication No. 2003/0102482A1, filed Jul. 19, 2002 and published Jun. 5, 2003, and entitled "STRAIN BALANCED NITRIDE HETROJUNCTION TRANSISTORS AND METHODS OF FABRICATING STRAIN BALANCED NITRIDE HETEROJUNCTION TRANSISTORS," and/or U.S. Pat. No. 6,841,001, entitled "STRAIN COMPENSATED SEMICONDUCTOR STRUCTURES AND METHODS OF FABRICATING STRAIN COMPENSATED SEMICONDUCTOR STRUCTURES," the disclosures of which are incorporated herein by reference as if set forth fully herein.

Appropriate SiC substrates are manufactured by, for example, Cree, Inc., of Durham, N.C., the assignee of the present invention, and methods for producing are described, for example, in U.S. Pat. No. Re. 34,861; U.S. Pat. Nos. 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed. For example, some embodiments of the present invention may utilize thick semi-insulating or insulating Group III-nitride layers and/or conducting substrates or layers as described in U.S. patent application Ser. No. 11/103,127, filed Apr. 11, 2005 and entitled "COMPOSITE SUBSTRATES OF CONDUCTIVE AND INSULTATING OR SEMI-INSULATING GROUP III-NITRIDES FOR GROUP III-NITRIDE DEVICES," and/or U.S. patent application Ser. No. 11/103,117, filed Apr. 11, 2005 and entitled "THICK SEMI-INSULATING OR INSULATING EPITAXIAL GALLIUM NITRIDE LAYERS AND DEVICES INCORPORATING SAME," the disclosures of which are incorporated herein by reference as if set forth in their entirety.

Returning to FIG. 1, an aluminum free Group III nitride barrier layer 12 is provided on the substrate 10. An aluminum free Group III-nitride channel layer 14 is provided on the barrier layer 12 and an aluminum free Group III-nitride cap layer 16 is provided on the channel layer 14. The barrier layer 12 may be deposited on the substrate 10 using buffer layers, transition layers, and/or nucleation layers as described above. The barrier layer 12 may be semi-insulating or insulating and/or may be unintentionally doped. In some embodiments, the barrier layer 12 and/or the cap layer 16 may include doped regions adjacent the channel layer 14. Furthermore, the barrier layer 12, channel layer 14, cap layer 16 and/or buffer nucleation and/or transition layers may be deposited by MOCVD or by other techniques known to those of skill in the art, such as MBE or HVPE.

The barrier layer 12 may be undoped or unintentionally doped. In some embodiments, the barrier layer 12 may include a thick semi-insulating or insulating layer with an undoped or unintentionally doped region adjacent the channel layer 14. The barrier layer 12 should be thick enough to prevent migration of Al in layers disposed opposite the channel layer 14 to the channel layer 14. Thus, portions of the barrier layer 12 may unintentionally include Al while still being an aluminum free Group III-nitride layer. For example, in some embodiments of the present invention, the barrier layer 12 may be from about 1 nm to about $1 \times 10^6$ nm thick and may have less than about 1% aluminum. In some embodiments of the present invention, the barrier layer 12 is about 1000 Å thick. Furthermore, a portion of the barrier layer 12 distal from the channel layer 14 may be doped with Fe or other elements to make it more insulating or provide a larger barrier as described in the above referenced patent applications. The barrier layer 12 may be provided as part or all of the substrate 10 or as a separate layer on the substrate 10.

In some embodiments of the present invention, the channel layer 14 is a Group III-nitride, such as $In_xGa_{1-x}N$, where $0 \leq x \leq 1$ provided that the energy of the conduction band edge of the channel layer 14 is less than the energy of the conduction band edge of the cap layer 16 at the interface between the channel and cap layers. In particular, the channel layer 14 may have a bandgap that is less than the bandgap of the cap layer 16 and the channel layer 14 may also have a larger electron affinity than the cap layer 16. Embodiments of the present invention where the channel layer 14 is in (i.e. x=1) may exhibit lower alloy scatter because InN is a binary material. The channel layer 14 may be undoped or unintentionally doped and may be grown to a thickness of greater than about 10 Å. For example, in some embodiments, the channel layer 14 may have a thickness of from about 10 Å to about 200 Å. The channel layer 14 may also be a multi-layer structure, such as a superlattice or combinations of GaN, InGaN or the like. In some embodiments of the present invention, the channel layer 14 has less than about 1% aluminum.

In particular embodiments of the present invention, the cap layer 16 is thick enough and/or has a high enough doping to induce a significant carrier concentration at the interface between the channel layer 14 and the cap layer 16 through polarization effects. As discussed above, the cap layer 16 may be a Group III-nitride and has a bandgap larger than that of the channel layer 14 and a smaller electron affinity than the channel layer 14. For example, the cap layer 16 may be GaN or InGaN. If the cap layer 16 is InGaN the cap layer 16 should have a lower indium percentage than is present in the channel layer 14. The cap layer 16 may, for example, be from about 5 nm to about 100 nm thick, but is not so thick as to cause cracking or substantial defect formation therein. The cap layer 16 may be thicker if the gate contact 24 is recessed into the cap layer 16. In certain embodiments of the present invention, the cap layer 16 is undoped and/or doped with an n-type dopant to a concentration of $1 \times 10^{16}$ cm$^{-3}$ about $1 \times 10^{21}$ cm$^{-3}$. In some embodiments of the present invention, the cap layer 16 has less than about 1% aluminum.

Source and drain ohmic contacts 20 and 22 are provided on the cap layer 16 and a gate contact 24 is disposed between the source and drain contacts 20 and 22. Suitable ohmic contact materials may include, for example, Ti, Al, Ni and/or Au. Suitable gate materials may depend on the composition of the cap layer, however, in certain embodiments, conventional materials capable of making a Schottky contact to a nitride based semiconductor material may be used, such as Ni, Pt, NiSi$_x$, Cu, Pd, Cr, W and/or WSiN.

Figure 2:
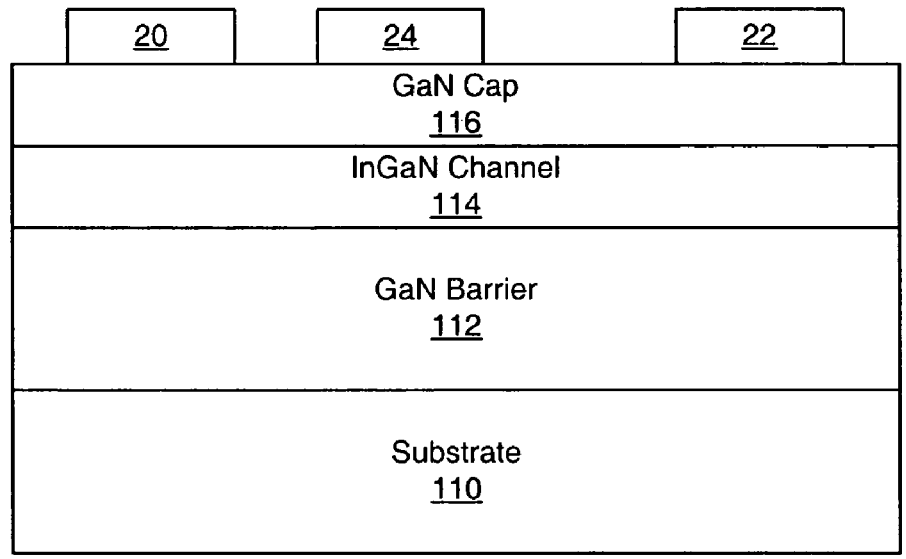
FIG. 2 is a cross-section of an aluminum free GaN based HEMT according to some embodiments of the present invention.

FIG. 2 is a schematic diagram of HEMTs according to further embodiments of the present invention. As seen in FIG. 2, a GaN barrier layer 112 is provided on a substrate 110. The substrate 110 may be a substrate as described above with reference to the substrate 10. Furthermore, optional buffer, nucleation and/or transition layers (not shown) may be provided on the substrate 110 as described above. These optional buffer, nucleation and/or transition layers may include aluminum. In particular embodiments of the present invention, the substrate 110 is a GaN substrate.

As is further illustrated in FIG. 2, an InGaN channel layer 114 is provided on the GaN barrier layer 112. A GaN cap layer 116 is provided on the InGaN channel layer 114.

In particular embodiments of the present invention, the GaN barrier layer 112 is a thick GaN layer and may be undoped, unintentionally doped and/or semi-insulating or insulating. For example, the GaN barrier layer 112 may be semi-insulating or insulating in a region proximate the substrate 110 and may be undoped or unintentionally doped in a region proximate the InGaN channel layer 114. The GaN barrier layer 112 should be sufficiently thick to prevent migration of Al in layers disposed opposite the channel layer 114 to the channel layer 114. Thus, portions of the barrier layer 112 may unintentionally include Al while still being an aluminum free layer. In some embodiments of the present invention, the barrier layer 112 may be from about 10 nm to about $1 \times 10^6$ nm thick. In particular embodiments of the present invention, the barrier layer 112 is at least about 1000 Å thick. In some embodiments of the present invention, the barrier layer 112 has less than about 1% aluminum.

The InGaN channel layer 114 may be In$_x$G$_{1-x}$aN, where $0 < x \leq 1$ provided that the energy of the conduction band edge of the channel layer 114 is less than the energy of the conduction band edge of the cap layer 116 at the interface between the channel and cap layers. In particular, the channel layer 114 may have a bandgap that is less than the bandgap of the cap layer 116 and the channel layer 114 may also have a larger electron affinity than the cap layer 116. The channel layer 114 may be undoped or unintentionally doped and may be grown to a thickness of greater than about 10 Å. For example, in some embodiments, the channel layer 114 may have a thickness of from about 10 Å to about 200 Å. The maximum thickness of the channel layer 114 may depend on the percentage of indium in the channel layer 114. The lower the percentage of indium in the channel layer 114, the thicker the channel layer 114 may be before an undesirable two dimensional hole gas is formed for Ga polar devices. A low or high indium percentage may be desirable to reduce or minimize impurity scattering. In particular embodiments of the present invention, the indium percentage is the channel layer 114 is about 30% or less. In some embodiments, the indium percentage is the channel layer 114 is about 20%. In some embodiments of the present invention, the channel layer 114 has less than about 1% aluminum.

The GaN cap layer 116 is thick enough and/or has a high enough doping to induce a significant carrier concentration at the interface between the channel layer 114 and the cap layer 116. In some embodiments of the present invention, the GaN cap layer 116 is from about 1 nm to about 100 nm thick, but is not so thick as to cause cracking or substantial defect formation therein. In some embodiments of the present invention, the cap layer 116 has less than about 1% aluminum. As discussed above, with reference to the cap layer 16, the cap layer 116 may be thicker if the gate contact 24 is recessed into the cap layer 116.

Figure 5:
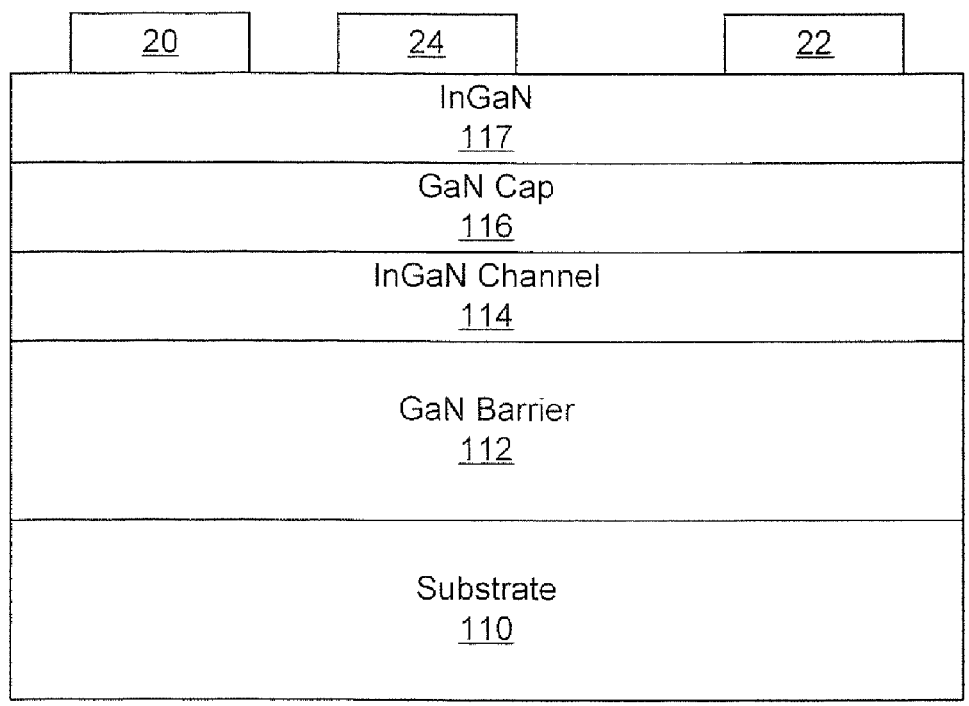
FIG. 5 is a cross-section of an aluminum free GaN based HEMT including an InGan layer on the cap layer according to some embodiments of the present invention.

Optionally, an InGaN layer 117 may be provided on the GaN cap layer 116 as illustrated in FIG. 5 The InGaN layer 117 may increase the barrier to the surface from the channel. If an InGaN 117 layer is provided on the GaN cap layer 116, the InGaN layer 117 may have an indium composition of from about 1% to 100% and may have a thickness of from about 1 nm to about 100 nm.

FIGS. 3A through 3D are schematic illustrations of further embodiments of HEMTs according the present invention having doped and/or spacer layers adjacent an InGaN channel layer 214. As seen in FIGS. 3A through 3D a GaN barrier layer 212 is provided on a substrate 210. An InGaN channel layer 214 is provided on the GaN barrier layer 212 and a GaN cap layer 216 is provided on the InGaN channel layer 214. The substrate 210, GaN barrier layer 212, InGaN channel layer 214 and GaN cap layer 216 may be provided as described above with reference to the substrate 110, GaN barrier layer 112, InGaN channel layer 114 and GaN cap layer 116 of FIG. 2. The optional buffer, nucleation and/or transition layers described above may also be provided. An optional InGaN layer (not shown) may also be provided on the cap layer 216 as described above.

Figure 3A:
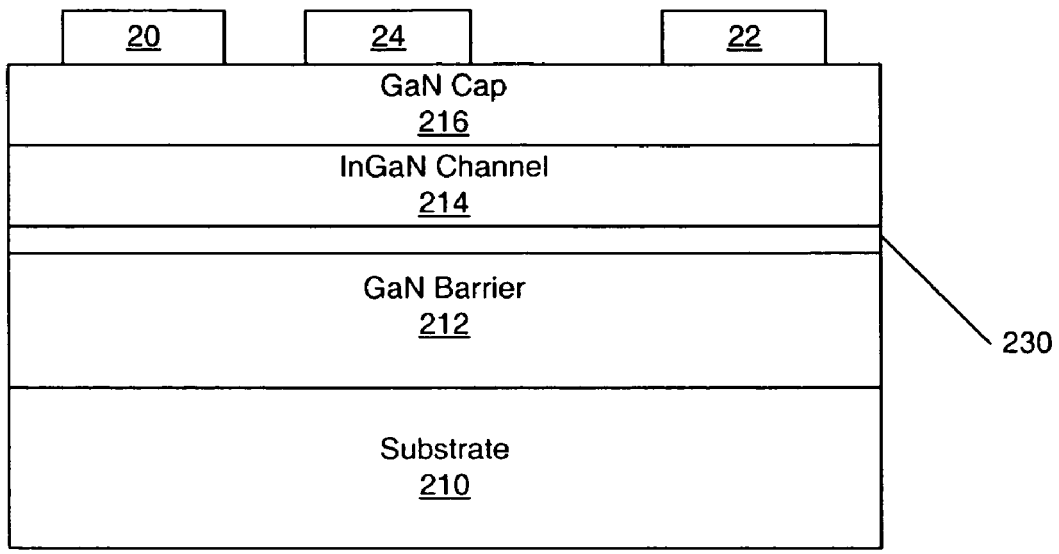
FIGS. 3A through 3E are cross-sections of aluminum free GaN based HEMTs according to further embodiments of the present invention.

FIG. 3A illustrates embodiments of the present invention where a doped GaN layer 230 is disposed between the GaN barrier layer 212 and the InGaN channel layer 214. In some embodiments of the present invention, the doped GaN layer 230 may be doped with Si, Ge, Sn and/or O and may have a dopant concentration of from about $1 \times 10^{16}$ cm$^{-3}$ to about $1 \times 10^{21}$ cm$^{-3}$. In particular embodiments, the dopant concentration may be about $1 \times 10^{20}$ cm$^{-3}$. Furthermore, the doped GaN layer 230 may be from about 0.2 nm to about 10 nm thick. The doping concentration should be high enough and the layer thick enough to supply sufficient electrons to the 2DEG channel, but not so high or thick as to have additional, unintentional n-type regions outside of the channel region. In particular embodiments, the dopant may be Sn and/or Ge. In other embodiments, the dopant may be Si. The doped GaN layer 230 may be provided as a delta doped region. In particular embodiments of the present invention, the doped layer 230 provides a sheet density of from about $1 \times 10^{12}$ cm$^{-2}$ to about $1 \times 10^{14}$ cm$^{-2}$ at the interface with the channel layer 214.

While the doped layer 230 is described above with reference to a GaN layer, in some embodiments of the present invention, the doped layer 230 may be provided by an InGaN layer. Thus, for example, the doped layer 230 may be provided by a doped region of the InGaN channel layer 214. In such a case, the InGaN channel layer 214 should be thick enough and the doped portion thin enough and doped lightly enough so that electrons from the doping are supplied to the 2DEG and do not form an n-type region in the doped region.

Figure 3B:
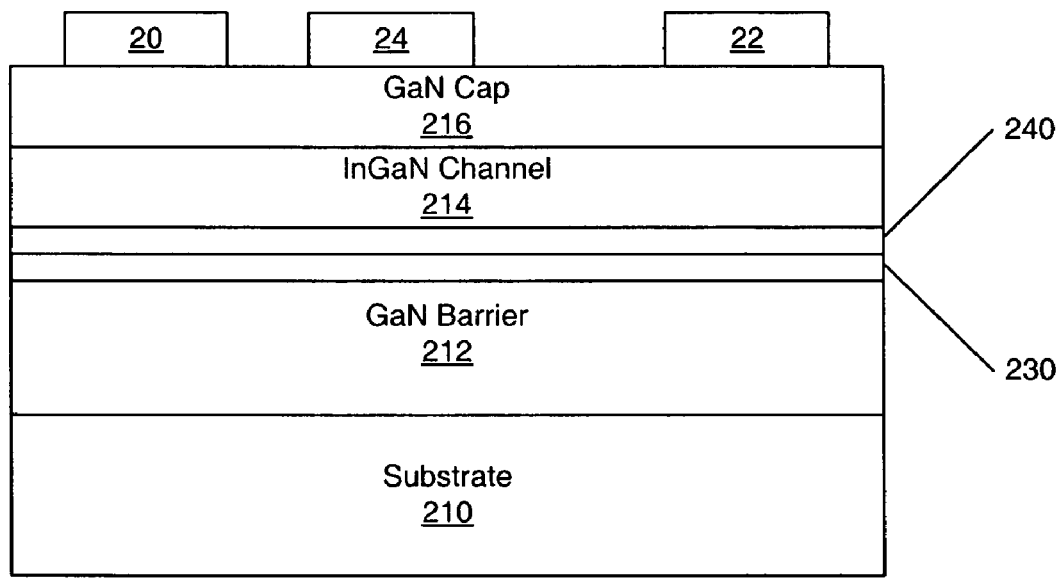

FIG. 3B illustrates embodiments of the present invention where a doped GaN layer 230 is disposed between the GaN barrier layer 212 and the InGaN channel layer 214 and an undoped GaN layer 240 is disposed between the doped GaN layer 230 and the InGaN channel layer 214. In some embodiments of the present invention, the undoped GaN layer 240 may be from about 0.5 nm to about 5 nm thick. The undoped GaN layer 240 may space the doped layer 230 from the channel layer 214 to reduce and/or minimize impurity scattering.

Figure 3C:
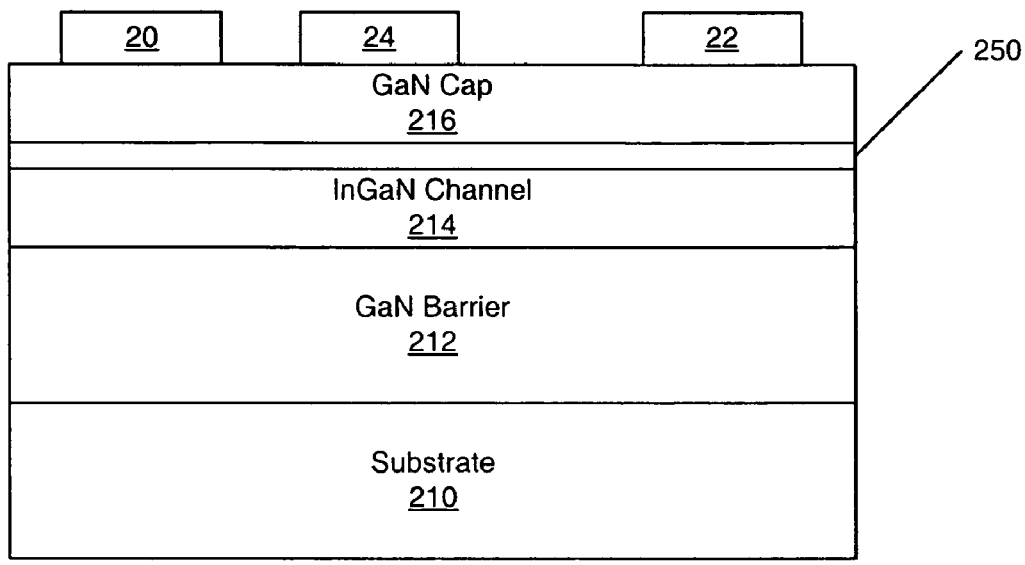

FIG. 3C illustrates embodiments of the present invention where a doped GaN layer 250 is disposed between the GaN cap layer 216 and the InGaN channel layer 214. In some embodiments of the present invention, the doped GaN layer 250 may be doped with Si, Sn, Ge and/or O and may have a dopant concentration of from about $1 \times 10^{16}$ cm$^{-3}$ to about $1 \times 10^{21}$ cm$^{-3}$. Furthermore, the doped GaN layer 250 may be from about 0.2 nm to about 100 nm thick. The structure of FIG. 3C could be used as a MESFET with the InGaN channel layer 214 acting more as a back barrier than a channel if the GaN layer 250 is doped heavily enough. Mobility may be better in the doped GaN layer 250 than in the InGaN channel layer 214 depending on the doping density and the indium percentage.

Figure 3D:
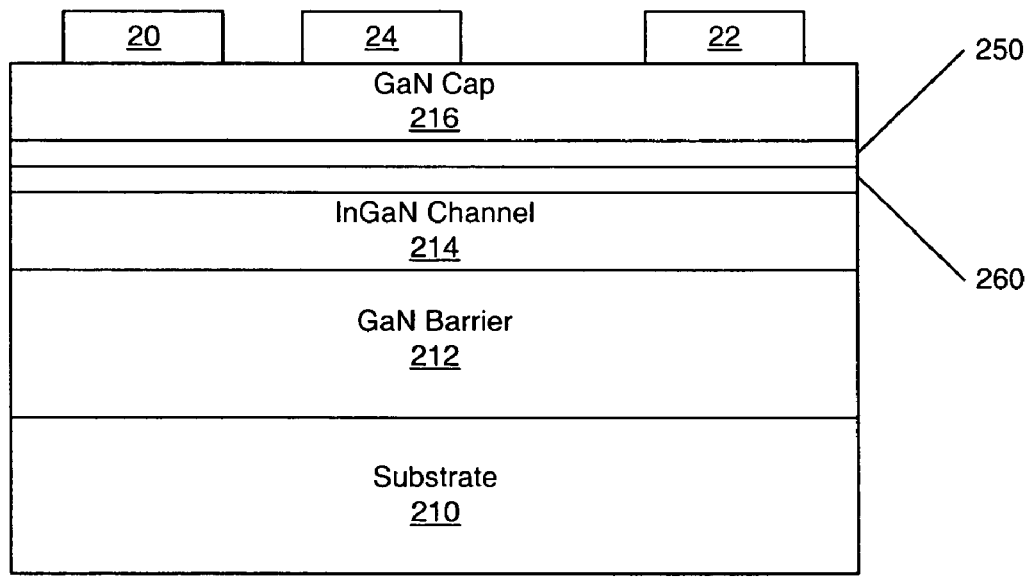

FIG. 3D illustrates embodiments of the present invention where a doped GaN layer 250 is disposed between the GaN cap layer 216 and the InGaN channel layer 214 and an undoped GaN layer 260 is disposed between the doped GaN layer 250 and the InGaN channel layer 214. In some embodiments of the present invention, the undoped GaN layer 260 may be from about 0.3 nm to about 10 nm thick. The undoped GaN layer 260 may space the doped layer 250 from the channel layer 214 to reduce and/or minimize impurity scattering.

Figure 3E:
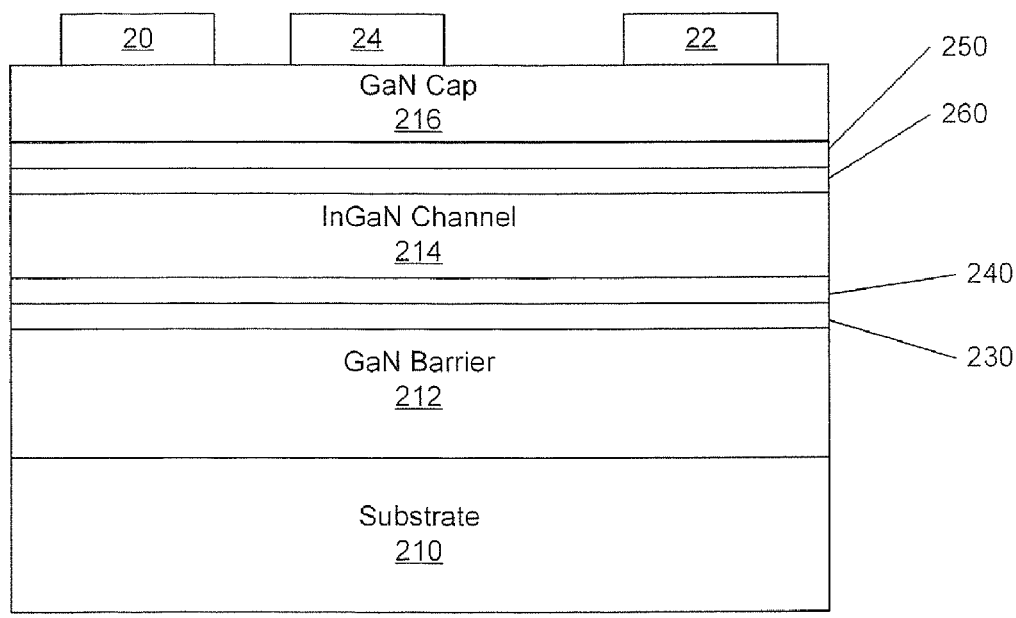

While embodiments of the present invention are illustrated in FIGS. 3A through 3D as including doped and/or undoped layers on one side or the other of the InGaN channel layer 214, combinations and subcombinations of the structures illustrated in FIGS. 3A through 3D may also be provided. For example, a structure with a doped layer between the cap layer 216 and the channel layer 214 may also have a doped layer between the barrier layer 212 and the channel layer 214 as illustrated in FIG. 3E.

A passivation layer (not shown) may also be provided on the structures of FIGS. 1 through 3D. In certain embodiments of the present invention, the passivation layer may be silicon nitride, aluminum nitride, silicon dioxide, an ONO structure and/or an oxynitride. Furthermore, the passivation layer may be a single or multiple layers of uniform and/or non-uniform composition.

Figure 4A:
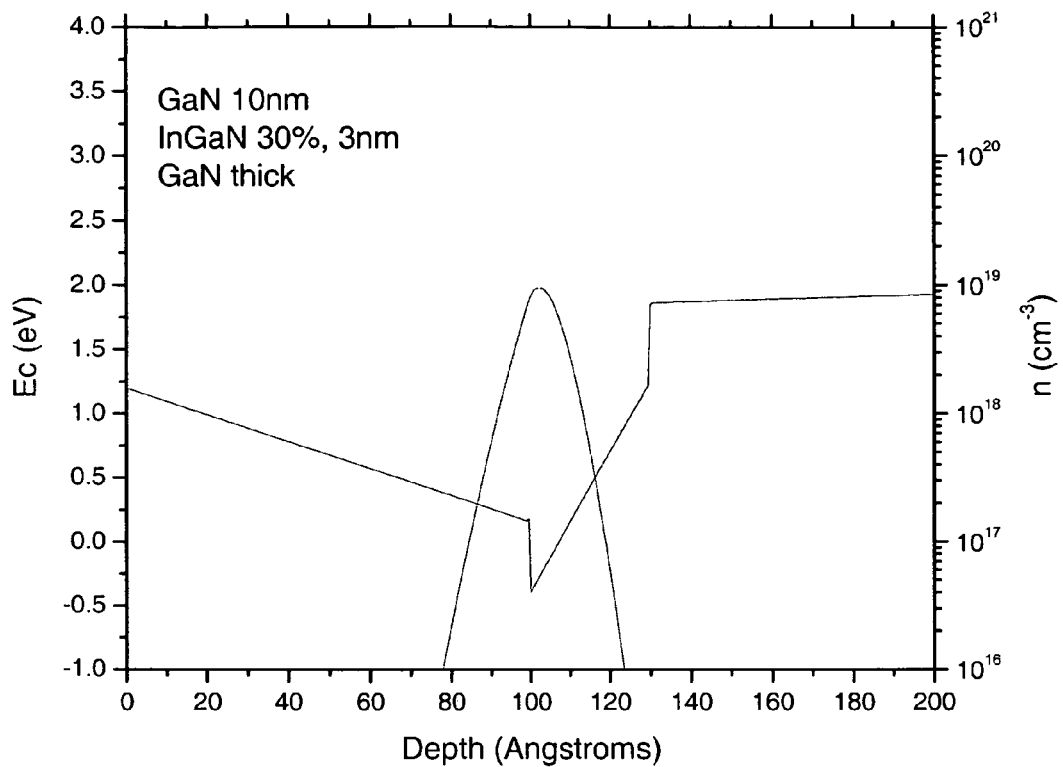
FIGS. 4A through 4N are graphs of carrier concentration and band diagrams from simulation models of transistors according to some embodiments of the present invention.
Figure 4B:
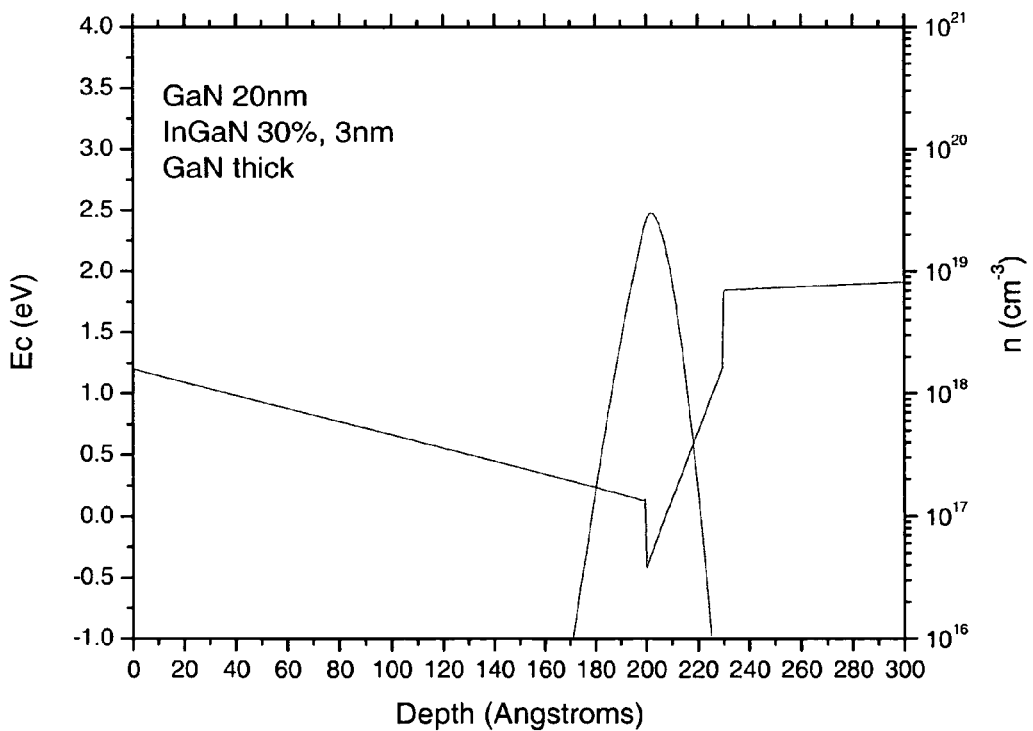
Figure 4C:
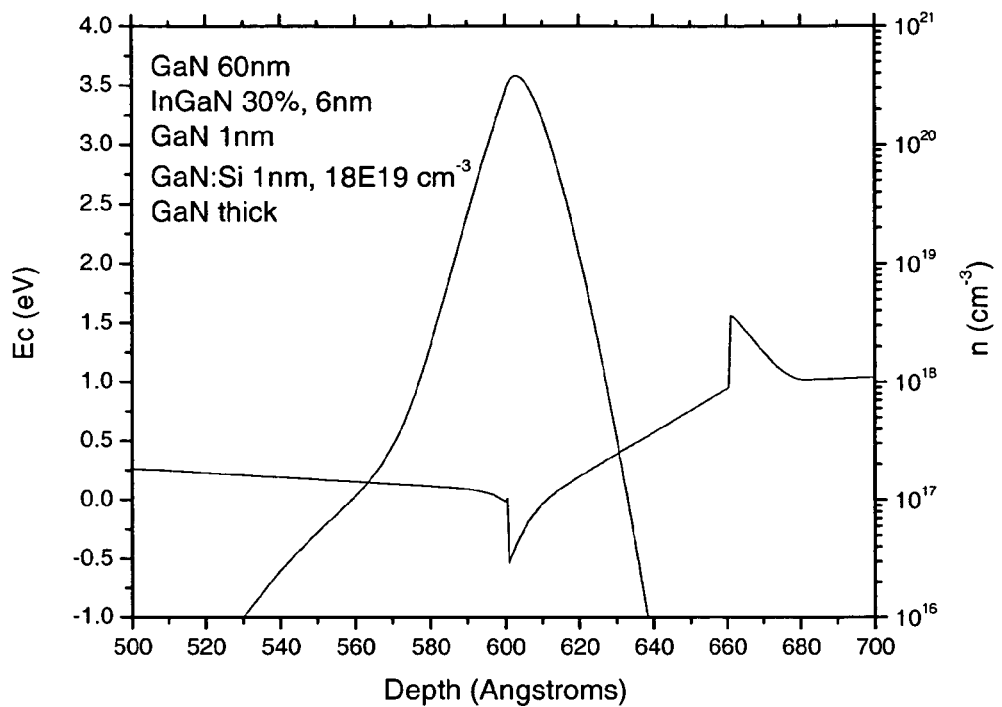
Figure 4D:
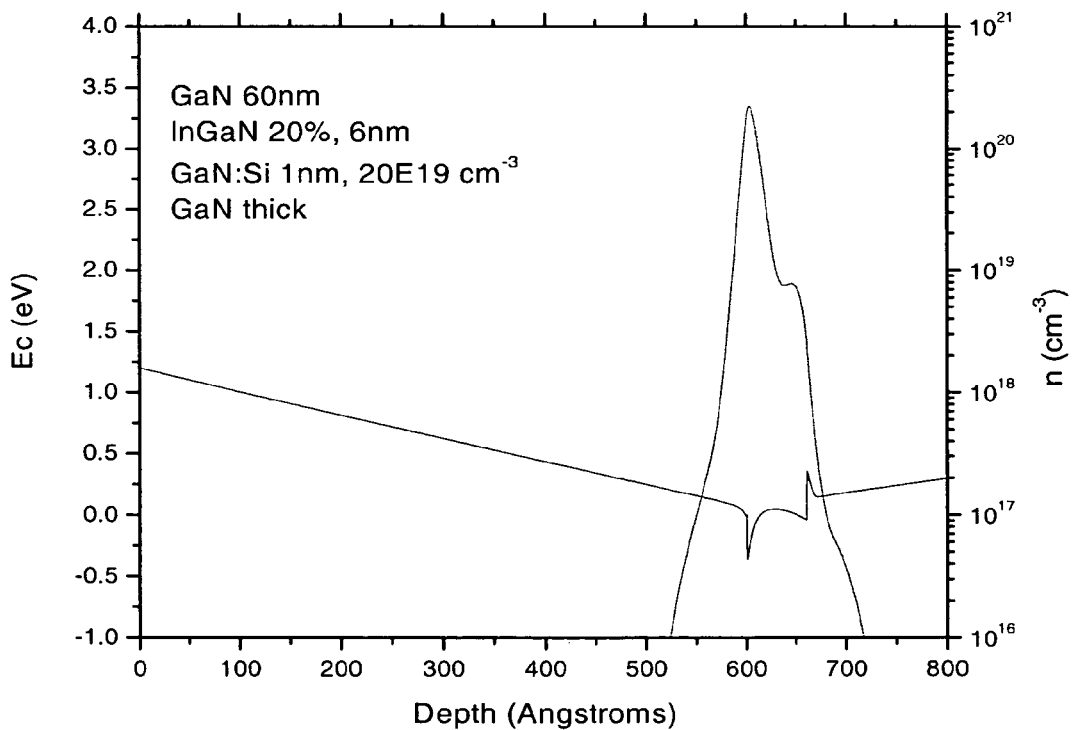
Figure 4E:
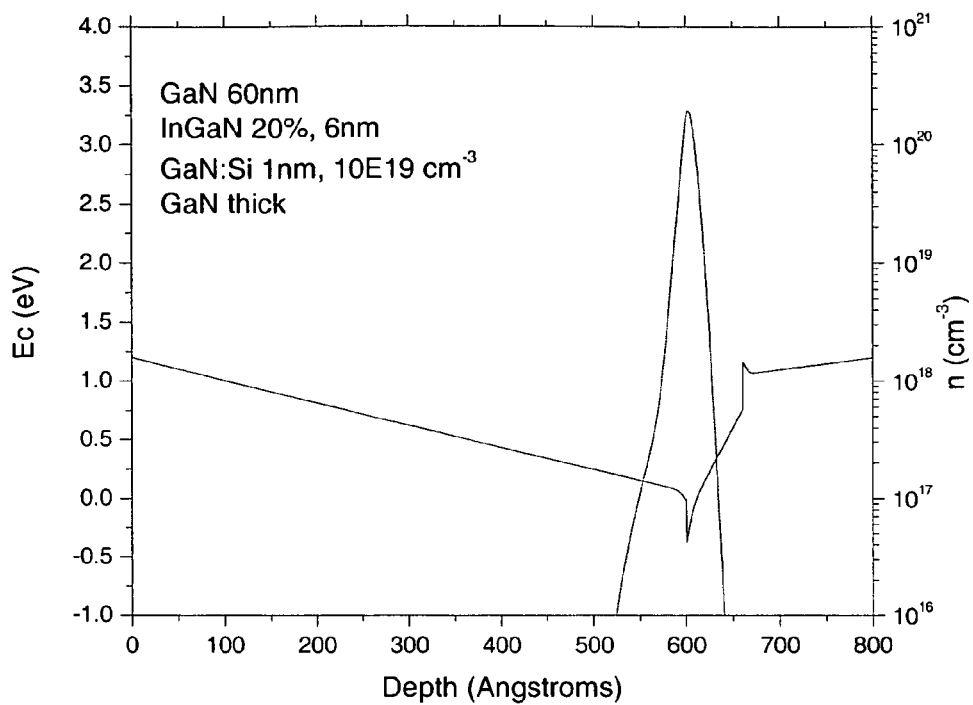
Figure 4F:
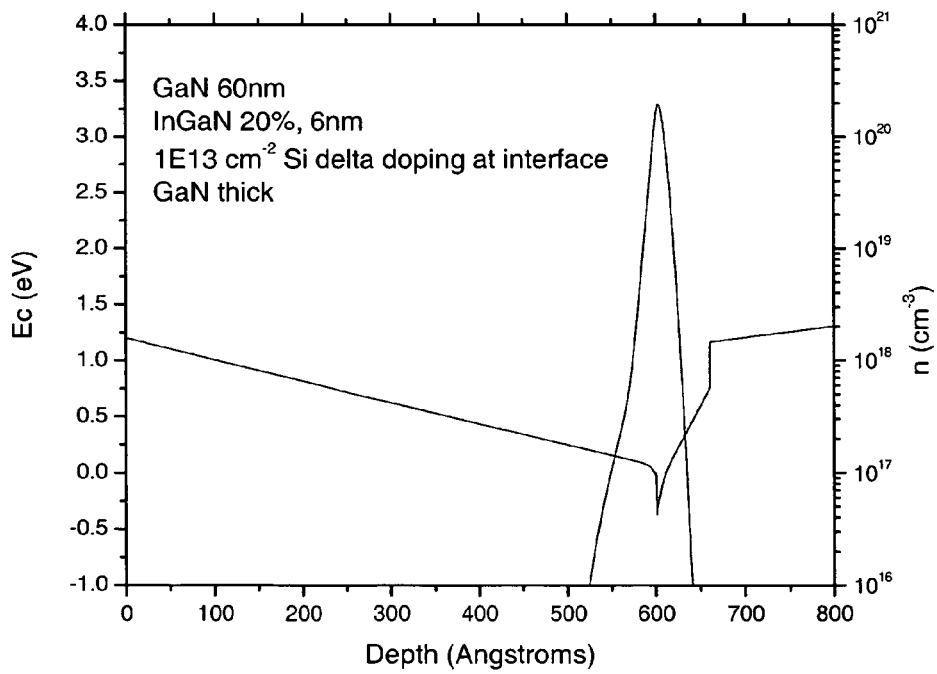
Figure 4G:
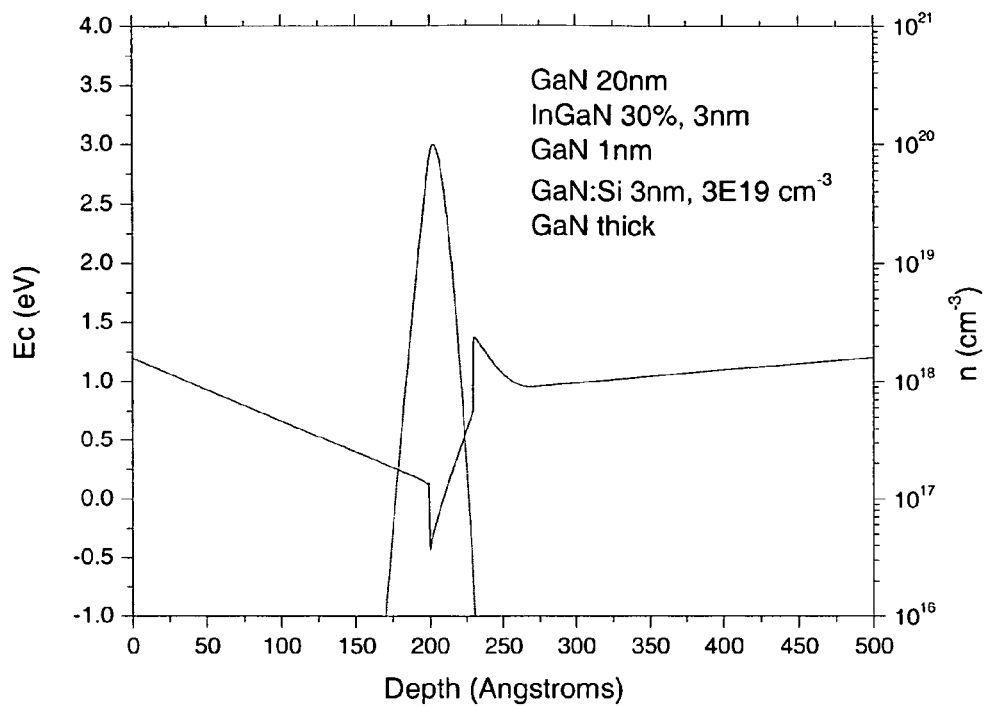
Figure 4H:
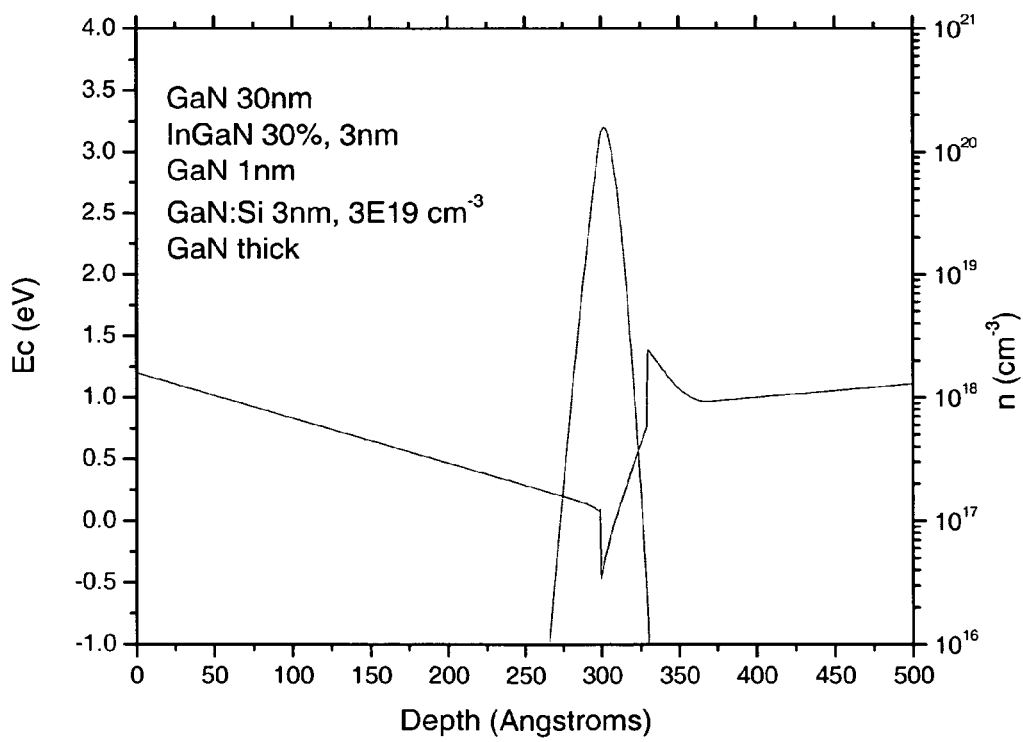
Figure 4I:
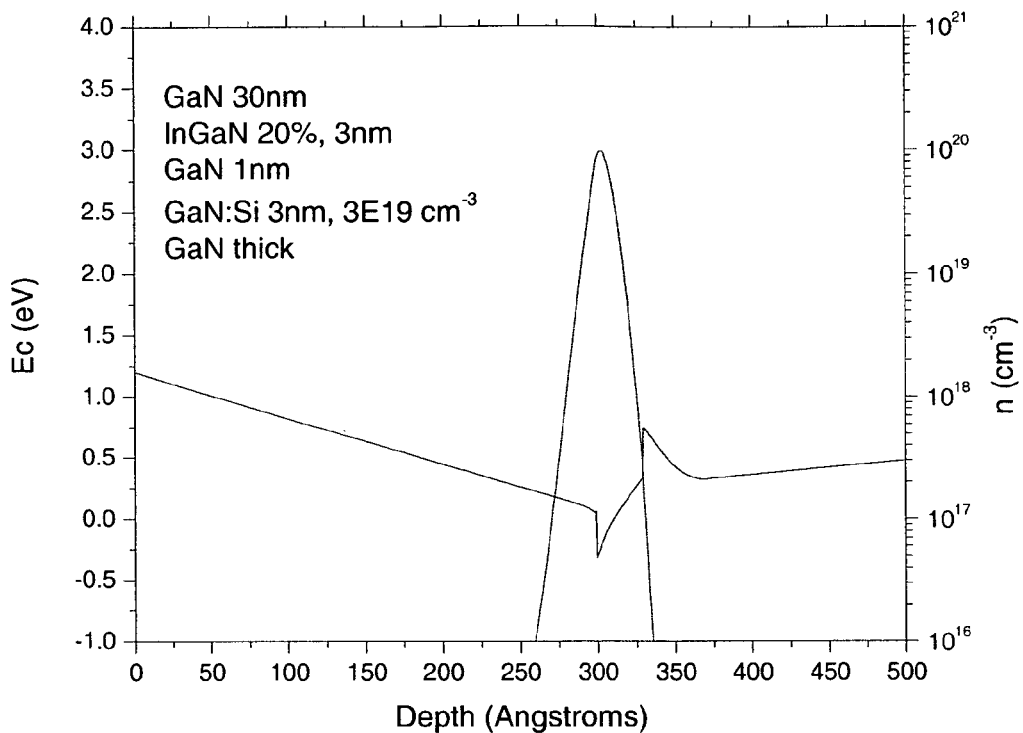
Figure 4J:
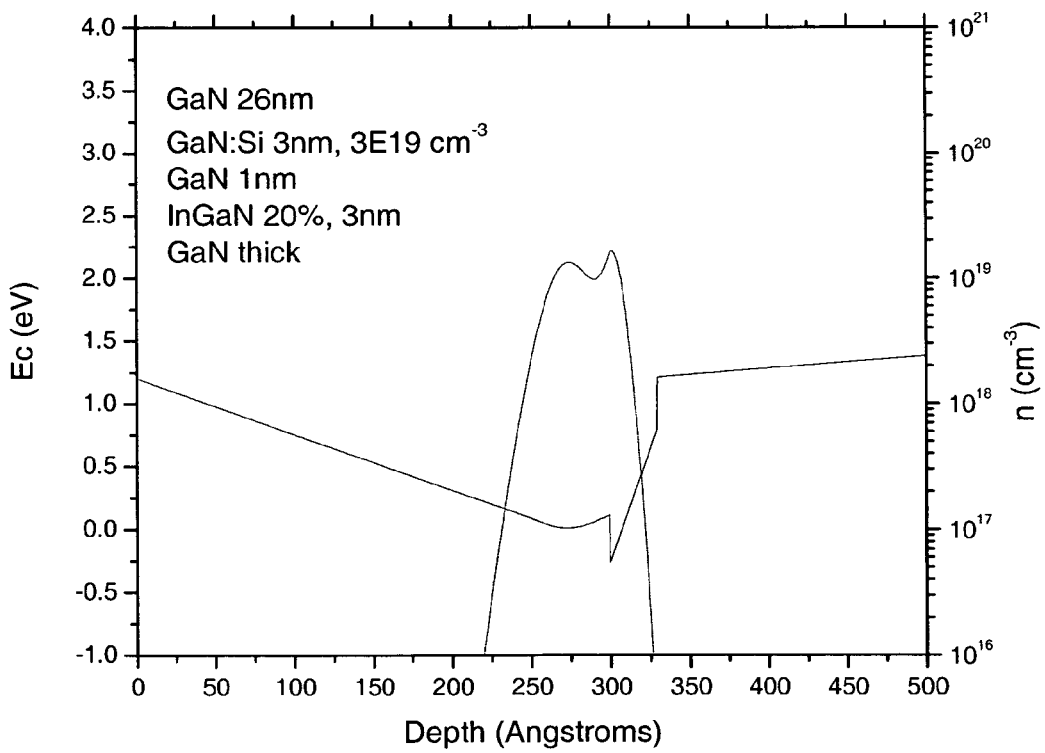
Figure 4K:
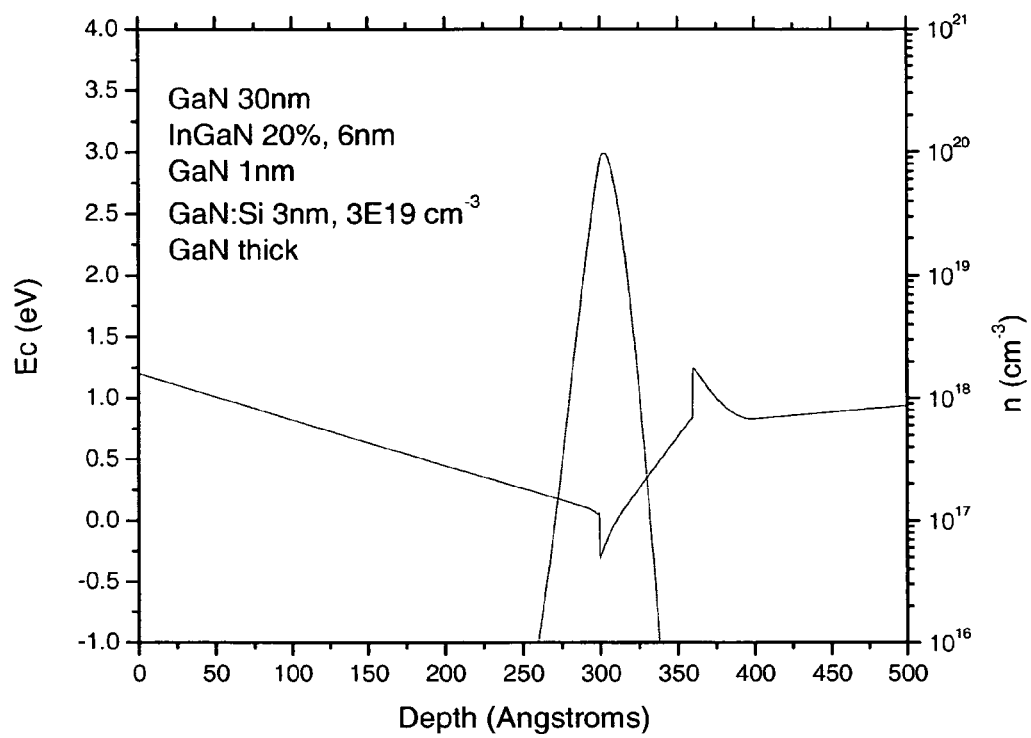
Figure 4L:
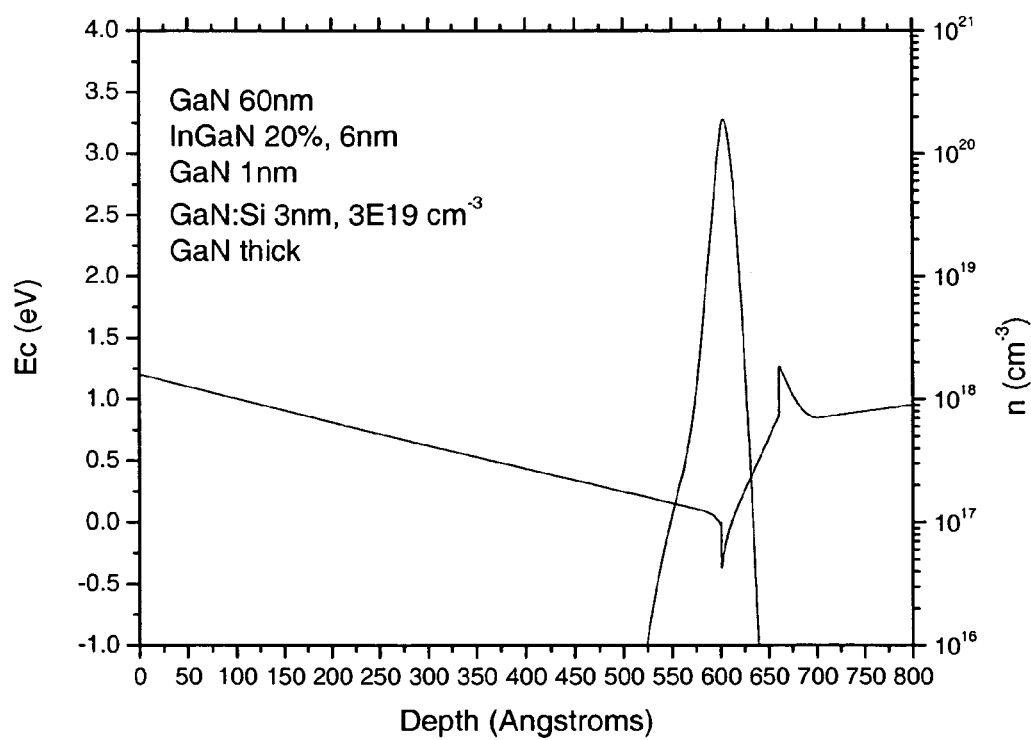
Figure 4M:
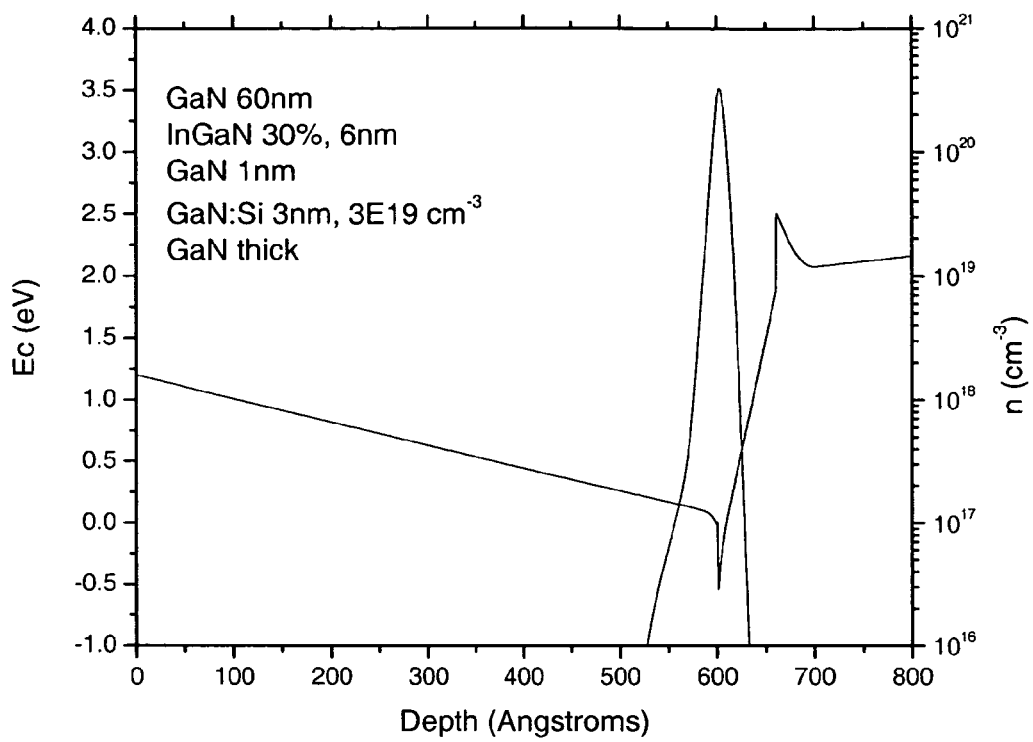
Figure 4N:
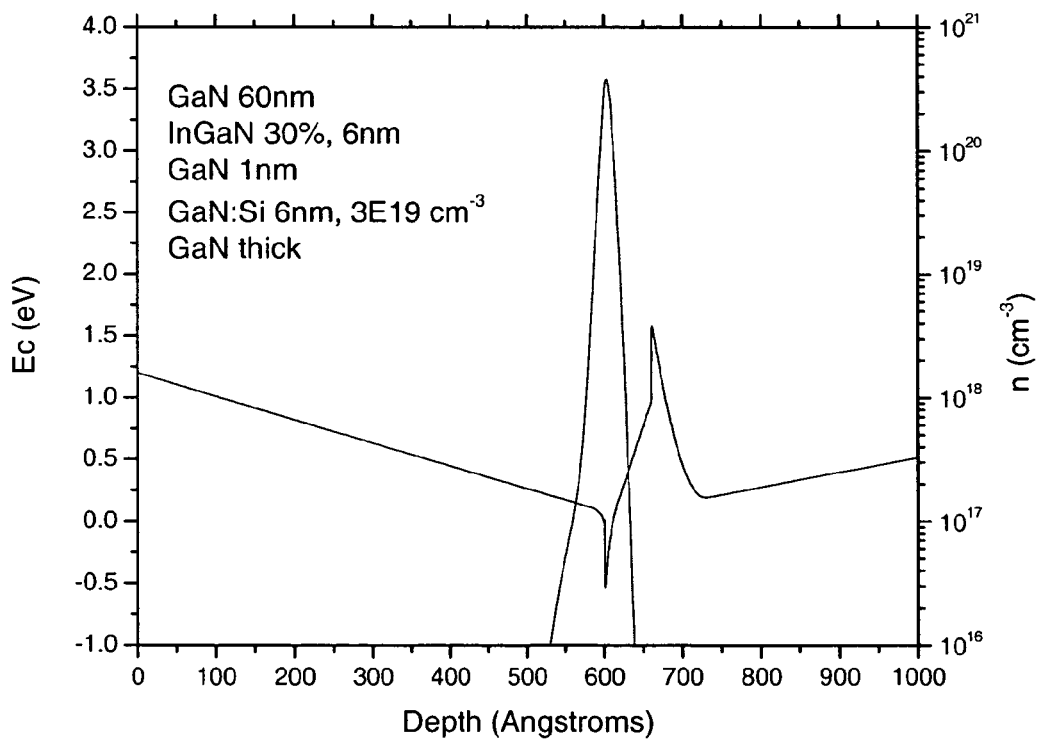

FIGS. 4A through 4N are graphs of carrier concentration and band diagrams from simulation models of transistors according to some embodiments of the present invention. In the simulations depicted in FIGS. 4A through 4N, the aluminum free layers are modeled as having 0% aluminum. These simulations are not meant to be exact but are provided to illustrate possible trends and to estimate properties of different designs. Accordingly, these graphs are provided as a rough estimate of possible characteristics of the simulated device structures but are only as accurate as the underlying assumptions and models. Accordingly, the properties of actual devices may differ from those illustrated in FIGS. 4A through 4N.

FIG. 4A illustrates a modeled band diagram and electron concentration for an aluminum free HEMT with a thick undoped GaN barrier layer, a 3 nm thick InGaN channel layer with 30% indium and a 10 nm thick undoped GaN cap layer. FIG. 4B illustrates a modeled band diagram and electron concentration for an aluminum free HEMT with a thick undoped GaN barrier layer, a 3 nm thick InGaN channel layer with 30% indium and a 20 nm thick undoped GaN cap layer. By comparing FIGS. 4A and 4B, an increase in peak electron concentration is predicted as a result of increasing the thickness of the GaN cap layer.

FIG. 4C illustrates a modeled band diagram and electron concentration for an aluminum free HEMT with a thick undoped GaN barrier layer, a 1 nm thick doped GaN layer with a dopant concentration of $18 \times 10^{19}$ cm$^{-3}$ between the barrier layer and the channel layer, a 1 nm thick undoped GaN layer between the doped GaN layer and the channel layer, a 6 nm thick InGaN channel layer with 30% indium and a 60 nm thick undoped GaN cap layer. As seen in FIG. 4C, the configuration of FIG. 4C is predicted to have a higher peak electron concentration than either of the configurations of FIGS. 4A and 4B.

FIG. 4D illustrates a modeled band diagram and electron concentration for an aluminum free HEMT with a thick undoped GaN barrier layer, a 1 nm thick doped GaN layer with a dopant concentration of $20 \times 10^{19}$ cm$^{-3}$ between the barrier layer and the channel layer, a 6 nm thick InGaN channel layer with 20% indium and a 60 nm thick undoped GaN cap layer. As seen in FIG. 4D, the configuration of FIG. 4D is predicted to have a higher peak electron concentration than either of the configurations of FIGS. 4A and 4B but may have a lower peak electron concentration than provided by the configuration of FIG. 4C.

FIG. 4E illustrates a modeled band diagram and electron concentration for an aluminum free HEMT with a thick undoped GaN barrier layer, a 1 nm thick doped GaN layer with a dopant concentration of $10 \times 10^{19}$ cm$^{-3}$ between the barrier layer and the channel layer, a 6 nm thick InGaN channel layer with 20% indium and a 60 nm thick undoped GaN cap layer. As seen in FIG. 4E, by increasing the dopant concentration in the doped GaN layer and increasing the thickness of the GaN cap layer, the configuration of FIG. 4E is predicted to have a higher peak electron concentration than either of the configurations of FIGS. 4A and 4B but may have a lower peak electron concentration than provided by the configuration of FIGS. 4C or 4D. The configuration of FIG. 4E is predicted to have a higher conduction band edge in the barrier layer than in FIG. 4D due to the lower doping.

FIG. 4F illustrates a modeled band diagram and electron concentration for an aluminum free HEMT with a thick undoped GaN barrier layer that is delta doped at $1 \times 10^{13}$ cm$^{-2}$ at the interface with the channel layer, a 6 nm thick InGaN channel layer with 20% indium and a 60 nm thick undoped GaN cap layer. As seen in FIG. 4F, the configuration of FIG. 4F is about the same as the configuration in FIG. 4E due to the same sheet doping density in both structures with slightly lower conduction band bending in the barrier due to the reduced thickness of the doped region.

FIG. 4G illustrates a modeled band diagram and electron concentration for an aluminum free HEMT with a thick undoped GaN barrier layer, a 3 nm thick doped GaN layer with a dopant concentration of $3 \times 10^{19}$ cm$^{-3}$ between the barrier layer and the channel layer, a 1 nm thick undoped GaN layer between the doped GaN layer and the channel layer, a 3 nm thick InGaN channel layer with 30% indium and a 20 nm thick undoped GaN cap layer. As seen in FIG. 4G, the configuration of FIG. 4G is predicted to have a higher peak electron concentration than either of the configurations of FIGS. 4A and 4B.

FIG. 4H illustrates a modeled band diagram and electron concentration for an aluminum free HEMT with a thick undoped GaN barrier layer, a 3 nm thick doped GaN layer with a dopant concentration of $3 \times 10^{19}$ cm$^{-3}$ between the barrier layer and the channel layer, a 1 nm thick undoped GaN layer between the doped GaN layer and the channel layer, a 3 nm thick InGaN channel layer with 30% indium and a 30 nm thick undoped GaN cap layer. As seen in FIG. 4H, the configuration of FIG. 4H is predicted to have a slightly higher peak electron concentration than the configuration of FIG. 4G as a result of the thicker GaN cap.

FIG. 4I illustrates a modeled band diagram and electron concentration for an aluminum free HEMT with a thick undoped GaN barrier layer, a 3 nm thick doped GaN layer with a dopant concentration of $3 \times 10^{19}$ cm$^{-3}$ between the barrier layer and the channel layer, a 1 nm thick undoped GaN layer between the doped GaN layer and the channel layer, a 3 nm thick InGaN channel layer with 20% indium and a 30 nm thick undoped GaN cap layer. As seen in FIG. 4I, the configuration of FIG. 4I is predicted to have a lower peak electron concentration than the configurations of FIG. 4H due to the lower In percentage.

FIG. 4J illustrates a modeled band diagram and electron concentration for an aluminum free HEMT with a thick undoped GaN barrier layer, a 3 nm thick doped GaN layer with a dopant concentration of $3 \times 10^{19}$ cm$^{-3}$ between the cap layer and the channel layer, a 1 nm thick undoped GaN layer between the doped GaN layer and the channel layer, a 3 nm thick InGaN channel layer with 20% indium and a 26 nm thick undoped GaN cap layer. As seen in FIG. 4J, the configuration of FIG. 4J is predicted to have two peaks in the electron concentration and has a lower peak electron concentration than configurations with a doped layer on the opposite side of the channel layer as seen in FIG. 4I. A structure similar to that of FIG. 4J could be used as a MESFET, as mentioned above.

FIG. 4K illustrates a modeled band diagram and electron concentration for an aluminum free HEMT with a thick undoped GaN barrier layer, a 3 nm thick doped GaN layer with a dopant concentration of $3 \times 10^{19}$ cm$^{-3}$ between the barrier layer and the channel layer, a 1 nm thick undoped GaN layer between the doped GaN layer and the channel layer, a 6 nm thick InGaN channel layer with 20% indium and a 30 nm thick undoped GaN cap layer. In comparison to the structure of FIG. 4I, the structure of FIG. 4K has a higher back barrier due to the thicker InGaN layer. See U.S. patent application Ser. No. 10/772,882, filed Feb. 5, entitled "NITRIDE HETEROJUNCTION TRANSISTORS HAVING CHARGE-TRANSFER INDUCED ENERGY BARRIERS AND METHODS OF FABRICATING THE SAME," the disclosure of which is incorporated herein as if set forth fully herein.

FIG. 4L illustrates a modeled band diagram and electron concentration for an aluminum free HEMT with a thick undoped GaN barrier layer, a 3 nm thick doped GaN layer with a dopant concentration of $3 \times 10^{19}$ cm$^{-3}$ between the barrier layer and the channel layer, a 1 nm thick undoped GaN layer between the doped GaN layer and the channel layer, a 6 nm thick InGaN channel layer with 20% indium and a 60 nm thick undoped GaN cap layer. As seen in FIGS. 4K and 4L, a thicker GaN cap may increase the charge in the channel.

FIGS. 4M and 4N illustrate modeling of configurations that vary the thickness of the GaN doped layer. The structure of FIG. 4M has a higher In concentration than the structure of FIG. 4L, resulting in a higher carrier concentration and higher conduction band in the barrier, but a lower mobility due to increased alloy scattering is likely. As seen in FIGS. 4M and 4N, FIG. 4N has a thicker doped layer than FIG. 4M and, therefore, a higher electron concentration in the channel and a lower conduction band energy in the barrier layer.

An aluminum free HEMT structure according to some embodiments of the present invention has been fabricated using a 60 nm GaN cap layer, a 6 nm InGaN channel layer with 20% In and a $1.7 \times 10^{13}$ cm$^{-2}$ Si delta doped region at the interface with a thick GaN barrier layer. Such device structure exhibited a sheet resistivity of approximately 1200 Ω/□.

While embodiments of the present invention have been described herein with reference to particular HEMT structures, the present invention should not be construed as limited to such structures. For example, additional layers may be included in the HEMT device while still benefiting from the teachings of the present invention. In some embodiments, insulating layers such as SiN, an ONO structure or relatively high quality AlN may be deposited for making a MISHEMT and/or passivating the surface. The additional layers may also include a compositionally graded transition layer or layers.

Also, other structures, such as recessed or "T" gate structures, regrown contact regions or the like may also be provided. Accordingly, some embodiments of the present invention provide aluminum free embodiments of structures such as those described in, for example, U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. Pat. No. 6,849,882 to Smorchkova et al., entitled "GROUP-III NITRIDE BASED HIGH ELECTRON MOBILITY TRANSISTOR (HEMT) WITH BARRIER/SPACER LAYER", U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," U.S. patent application Ser. No. 10/772,882 filed Feb. 5, 2004 for "NITRIDE HETEROJUNCTION TRANSISTORS HAVING CHARGE-TRANSFER INDUCED ENERGY BARRIERS AND METHODS OF FABRICATING THE SAME," U.S. patent application Ser. No. 10/897,726, filed Jul. 23, 2004 entitled "METHODS OF FABRICATING NITRIDE-BASED TRANSISTORS WITH A CAP LAYER AND A RECESSED GATE," U.S. patent application Ser. No. 10/849,617, filed May 20, 2004 entitled "METHODS OF FABRICATING NITRIDE-BASED TRANSISTORS HAVING REGROWN OHMIC CONTACT REGIONS AND NITRIDE-BASED TRANSISTORS HAVING REGROWN OHMIC CONTACT REGIONS," U.S. patent application Ser. No. 10/849, 589, filed May 20, 2004 and entitled "SEMICONDUCTOR DEVICES HAVING A HYBRID CHANNEL LAYER, CURRENT APERTURE TRANSISTORS AND METHODS OF FABRICATING SAME," U.S. Patent Publication No. 2003/0020092 filed Jul. 23, 2002 and published Jan. 30, 2003 for "INSULATING GATE ALGAN/GAN HEMT", U.S. patent application Ser. No. 10/996,249, filed Nov. 23, 2004 and entitled "CAP LAYERS AND/OR PASSIVATION LAYERS FOR NITRIDE-BASED TRANSISTORS, TRANSISTOR STRUCTURES AND METHODS OF FABRICATING SAME," U.S. patent application Ser. No. 11/080,905 filed Mar. 15, 2005 and entitled "GROUP III NITRIDE FIELD EFFECT TRANSISTORS (FETs) CAPABLE OF WITHSTANDING HIGH TEMPERATURE REVERSE BIAS TEST CONDITIONS," U.S. patent application Ser. No. 11/005,107, filed Dec. 6, 2004 and entitled "HIGH POWER DENSITY AND/OR LINEARITY TRANSISTORS," and U.S. patent application Ser. No. 11/005,423, filed Dec. 6, 2004 and entitled "FIELD EFFECT TRANSISTORS (FETs) HAVING MULTI-WATT OUTPUT POWER AT MILLIMETER-WAVE FREQUENCIES," the disclosures of which are incorporated herein as if described in their entirety. Embodiments of the present invention may also be utilized with HEMT structures such as described in, for example, Yu et al., "Schottky barrier engineering in III-V nitrides via the piezoelectric effect," Applied Physics Letters, Vol. 73, No. 13, 1998, or in U.S. Pat. No. 6,584,333 filed Jul. 12, 2001, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A high electron mobility transistor (HEMT), comprising:
    an aluminum free Group III-nitride barrier layer;
    an aluminum free Group III-nitride channel layer on the barrier layer;
    an aluminum free Group III-nitride cap layer on the channel layer; and
    a first doped GaN layer between the barrier layer and the channel layer, the first doped GaN layer comprising a Tin (Sn), Oxygen (O) and/or Germanium (Ge) doped GaN layer.

2. The HEMT of claim 1, wherein the barrier layer comprises a doped Group III-nitride region between the aluminum free Group III-nitride channel layer and a substrate and wherein the barrier layer is doped with iron (Fe).

3. The HEMT of claim 2, further comprising an undoped Group III-nitride layer disposed between the doped Group III-nitride region and the channel layer.

4. The HEMT of claim 1, wherein the barrier layer comprises a GaN layer, the channel layer comprises an InGaN layer and the cap layer comprises a GaN layer.

5. The HEMT of claim 4, wherein the barrier layer has a thickness of from about 3.0 nm to about 1 mm, the channel layer has a thickness of from about 0.3 nm to about 19 nm or from about 21 nm to about 50 nm and the cap layer has a thickness of from about 1 nm to about 19 nm or from about 21 nm to about 100 nm.

6. The HEMT of claim 4, wherein the InGaN layer has a percentage of indium of from about 1% to about 9% or from about 11% to about 100%.

7. The HEMT of claim 1, wherein the first doped GaN layer has a thickness of from about 0.2 nm to about 9 nm.

8. The HEMT of claim 1, wherein the first doped GaN layer has a dopant concentration of from about $1\times10^{17}$ cm$^{-3}$ to about $1\times10^{-}$cm$^{-3}$ or from about $1\times10^{20}$ cm$^{-3}$ to about $1\times10^{21}$ cm$^{-3}$.

9. The HEMT of claim 1, further comprising a first undoped GaN layer disposed between the first doped GaN layer and an InGaN channel layer.

10. The HEMT of claim 9, wherein the first undoped GaN layer has a thickness of from about 0.3 nm to about 4.5 nm or from about 5.5 nm to about 10 nm.

11. The HEMT of claim 1, wherein the channel layer comprises a doped Group III-nitride region on the aluminum free Group III-nitride barrier layer.

12. The HEMT of claim 11, wherein the channel layer comprises an InGaN channel layer and the barrier layer comprises a GaN barrier layer, the InGaN channel layer comprising a doped region on the GaN barrier layer.

13. The HEMT of claim 1, wherein the HEMT further comprises a silicon carbide substrate and wherein the aluminum free Group III-nitride barrier layer is on the silicon carbide substrate.

14. The HEMT of claim 1, wherein the barrier layer comprises an undoped barrier layer.

* * * * *

UNITED STATES PATENT AND TRADEMARK OFFICE
CERTIFICATE OF CORRECTION

PATENT NO. : 7,615,774 B2  Page 1 of 1
APPLICATION NO. : 11/118575
DATED : November 10, 2009
INVENTOR(S) : Saxler It is certified that error appears in the above-identified patent and that said Letters Patent is hereby corrected as shown below:

Title Page:

Other Publications, Page 3, Left Column, line 58: Please correct "United States Patent Application entitled "Thick Semi-Insulating of" to read -- United States Patent Application entitled "Thick Semi-Insulating or --

In the Claims:

Column 14, Claim 8, Line 28: Please correct "about $1 \times 10^{\sim}$ $cm^{-3}$" to read -- about $1 \times 10^{18}$ $cm^{-3}$ --

Signed and Sealed this

Second Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,615,774 B2 Page 1 of 1
APPLICATION NO. : 11/118575
DATED : November 10, 2009
INVENTOR(S) : Adam William Saxler It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 708 days.

Signed and Sealed this

Nineteenth Day of October, 2010

David J. Kappos
*Director of the United States Patent and Trademark Office*